(12) United States Patent
Prather et al.

(10) Patent No.: US 7,109,107 B2
(45) Date of Patent: Sep. 19, 2006

(54) METHOD FOR CREATING FLIP-CHIP CONDUCTIVE-POLYMER BUMPS USING PHOTOLITHOGRAPHY AND POLISHING

(75) Inventors: Dennis W. Prather, Newark, DE (US); Saurabh Lohokare, Newark, DE (US)

(73) Assignee: University of Delaware, Newark, DE (US)

( * ) Notice: Subject to any disclaimer, the term of this patent is extended or adjusted under 35 U.S.C. 154(b) by 0 days.

(21) Appl. No.: 10/710,870

(22) Filed: Aug. 9, 2004

(65) Prior Publication Data

US 2005/0032272 A1 Feb. 10, 2005

Related U.S. Application Data

(60) Provisional application No. 60/481,196, filed on Aug. 8, 2003.

(51) Int. Cl.
*H01L 21/44* (2006.01)
*H01L 23/48* (2006.01)

(52) U.S. Cl. ...................... 438/614; 257/748

(58) Field of Classification Search ........ 257/734–737, 257/741, 748, 778–784; 438/108, 123, 612–616, 438/677, 695
See application file for complete search history.

(56) References Cited

U.S. PATENT DOCUMENTS

| | | | | |
|---|---|---|---|---|
| 5,587,342 A | * | 12/1996 | Lin et al. | ..................... 438/125 |
| 6,108,210 A | | 8/2000 | Chung | |
| 6,448,164 B1 | * | 9/2002 | Lyons et al. | ................. 438/585 |
| 6,534,422 B1 | * | 3/2003 | Ichikawa et al. | ........... 438/780 |
| 2005/0025973 A1 | * | 2/2005 | Slutz et al. | ................. 428/408 |

OTHER PUBLICATIONS

"Using PDMS Microtransfer Molding for Polymer Flip-Chip", Wong et al., 2003 Electronic Components and Technology Conference, IEEE, pp. 652-657.
"A New Flip-Chip Bonding Technique Using Micromachined Conductive Polymer Bumps", Oh et al., IEEE Transactions on Advanced Packaging, vol. 22, No. 4, Nov. 1999, pp. 586-591.
"High-Performance, 1.55 µm AlGaAsSb/AlGaAsSb pin Photodetectors", S.K. Lohokare et al., Electronics Letters, Oct. 14, 2004, vol. 40, No. 21.
"InGaAs-Based High Performance p-i-n Photodiodes", Ibrahim Kimukin, et al., IEEE Photonics Technology Letters, vol. 14, No. 3, Mar. 2002.
"Recent Developments in Ohmic Contacts for III-V Compound Semiconductors", T.C. Shen et al., J. Vac. Sci. Technol. B 10(5), Sep./Oct. 1992, American Vacuum Society, pp. 2113-2132.

* cited by examiner

*Primary Examiner*—Andy Huynh
*Assistant Examiner*—Calvin Lee
(74) *Attorney, Agent, or Firm*—Connolly Bove Lodge & Hutz LLP; Larry J. Hume

(57) ABSTRACT

A method for fabricating a flip-chip semiconductor device having plural conductive polymer bumps includes forming plural molds on a substrate using a photolithographic technique; filling the molds by applying and spinning a layer of conductive polymer material onto the substrate; polishing the conductive polymer material layer to remove excess conductive material from a surface of the substrate; and stripping the plural molds from the substrate to reveal the plural bumps. In various aspects of disclosure, either positive resist or negative resist may be used. The electrical contact resistance compares favorably with squeegee-based bumps; there is an improvement in the contact resistance of the bumps patterned using polishing techniques in comparison to that of squeegee-based conductive polymer bumps.

10 Claims, 11 Drawing Sheets

Fabrication Steps

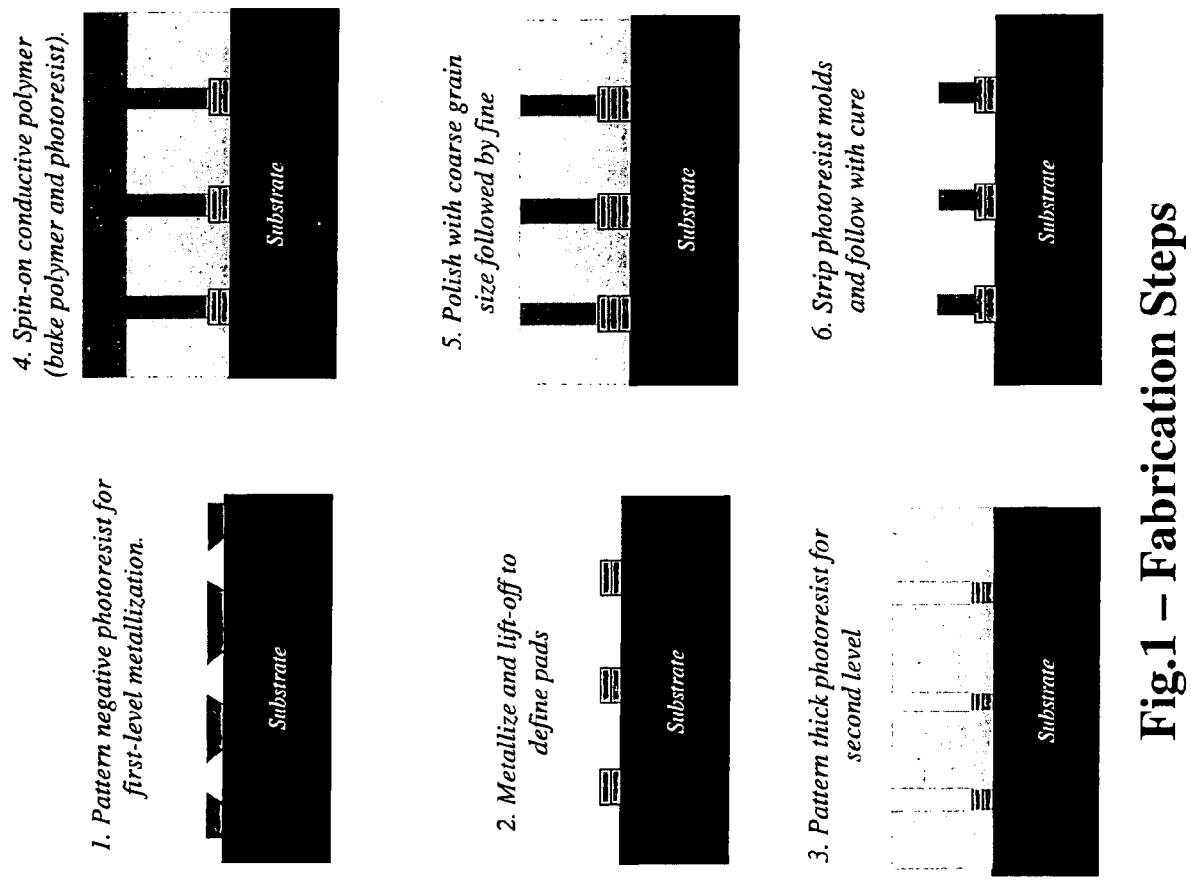
Fig.1 – Fabrication Steps

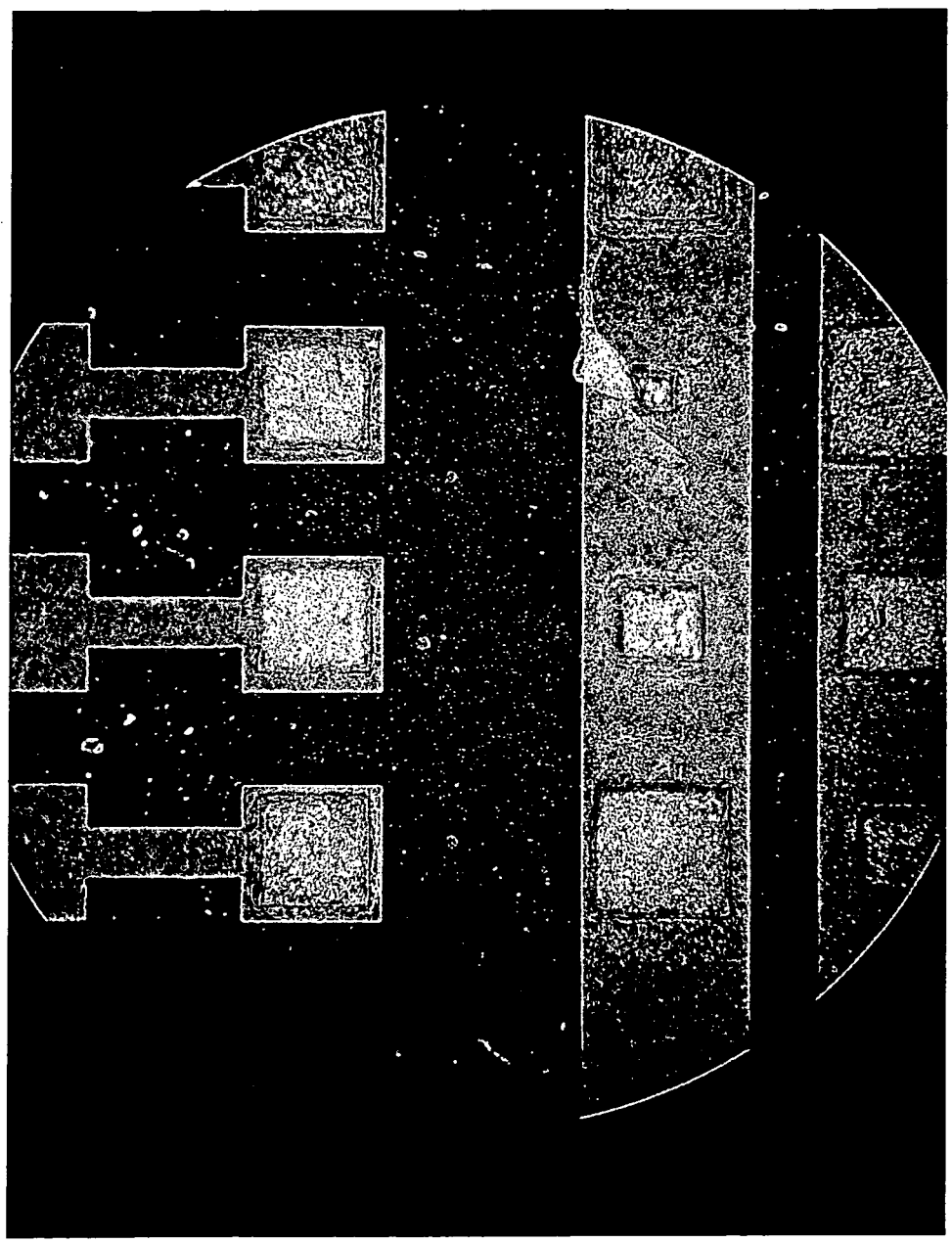
Fig. 2 – Polymer Bumps Under Optical Microscope

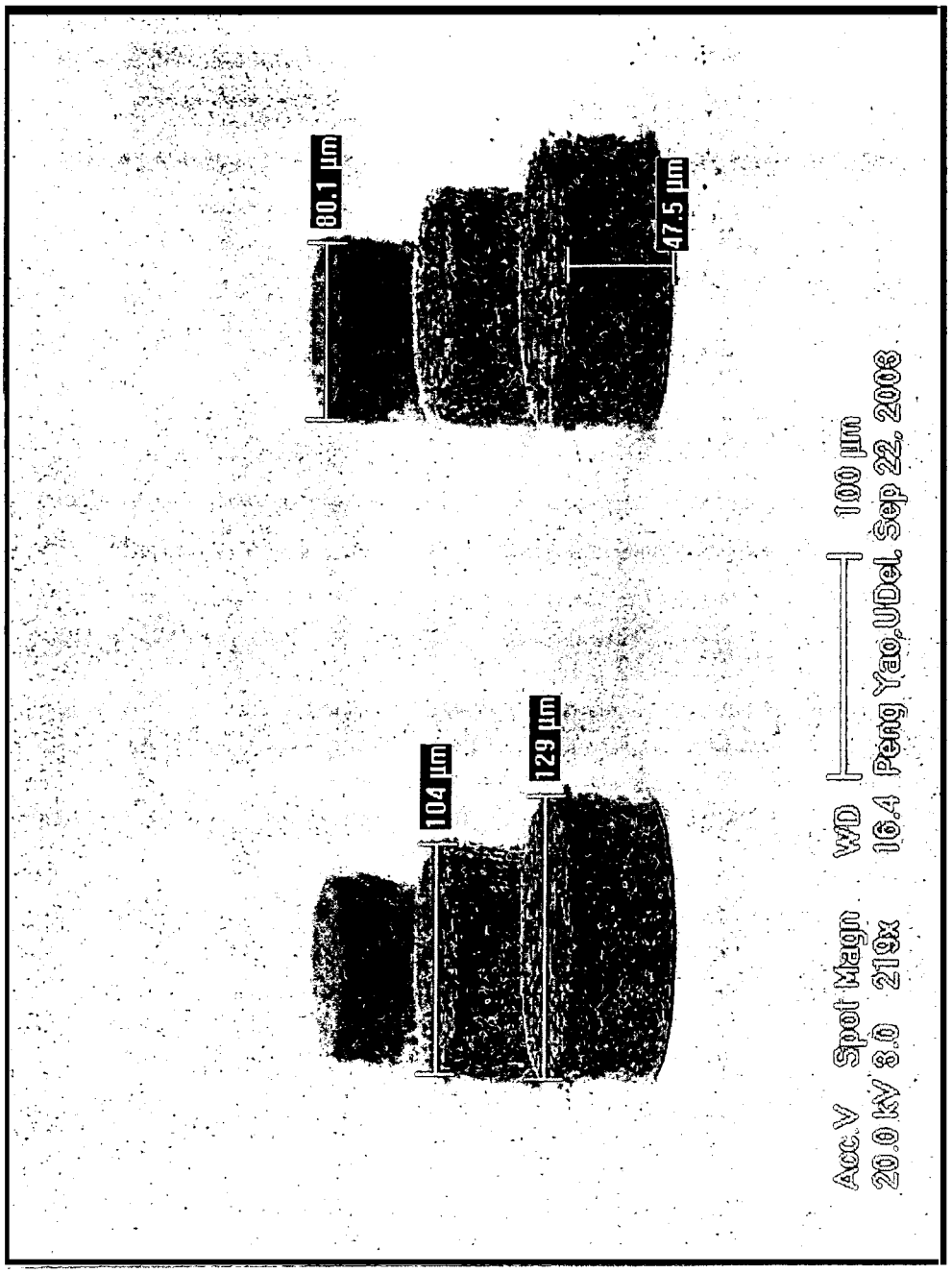
Fig. 3 - SEM View of Surface of Polished Polymer Bumps

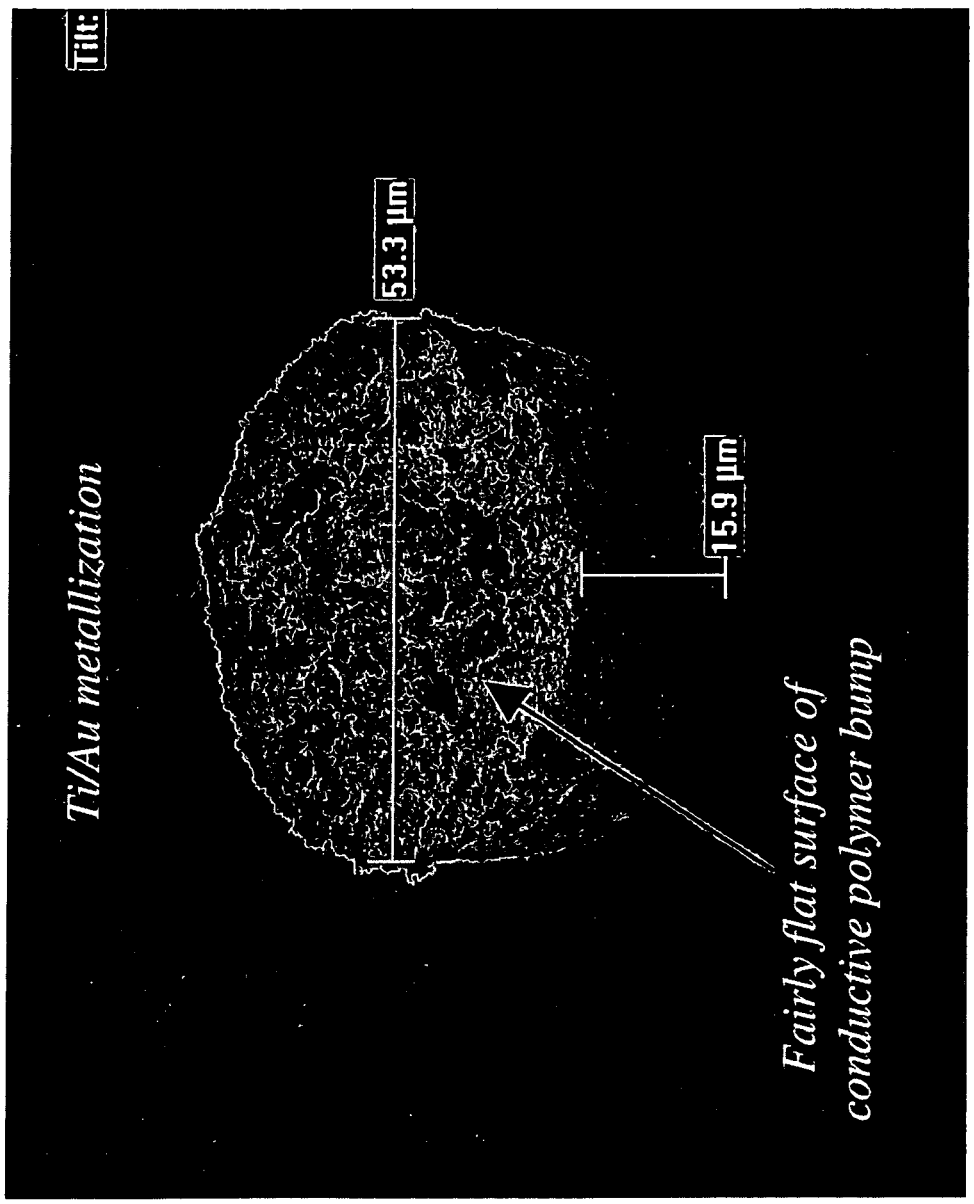
Fig. 4 - SEM View of Surface of Polished Conductive Polymer Bumps

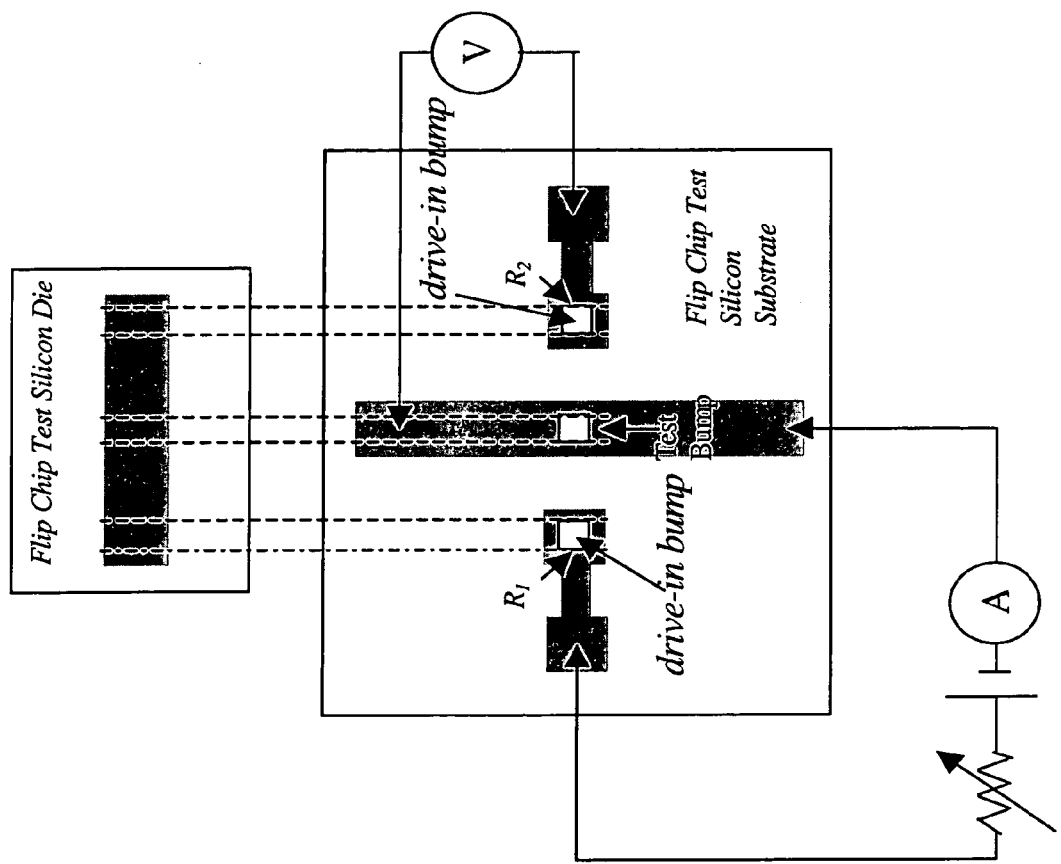
Fig. 5 - Contact Resistance Test Setup

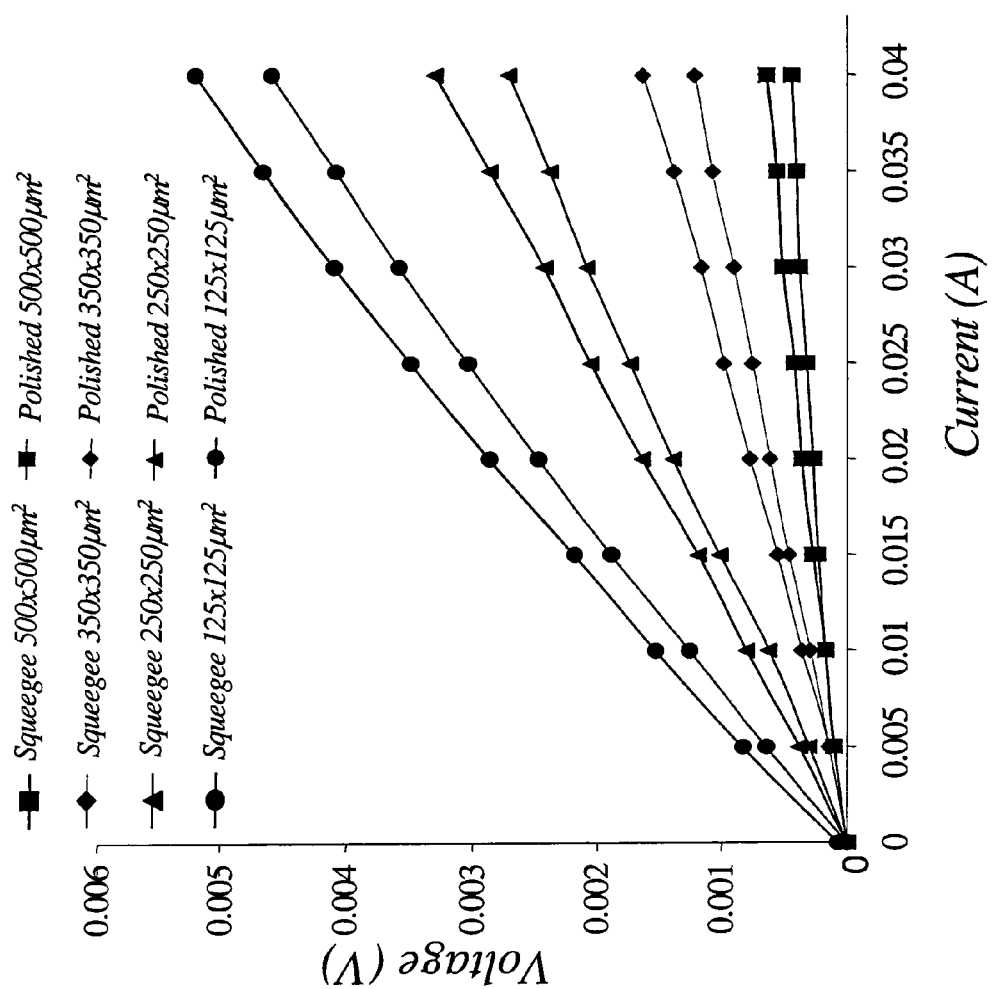
Fig. 6 - Contact Resistance Comparison

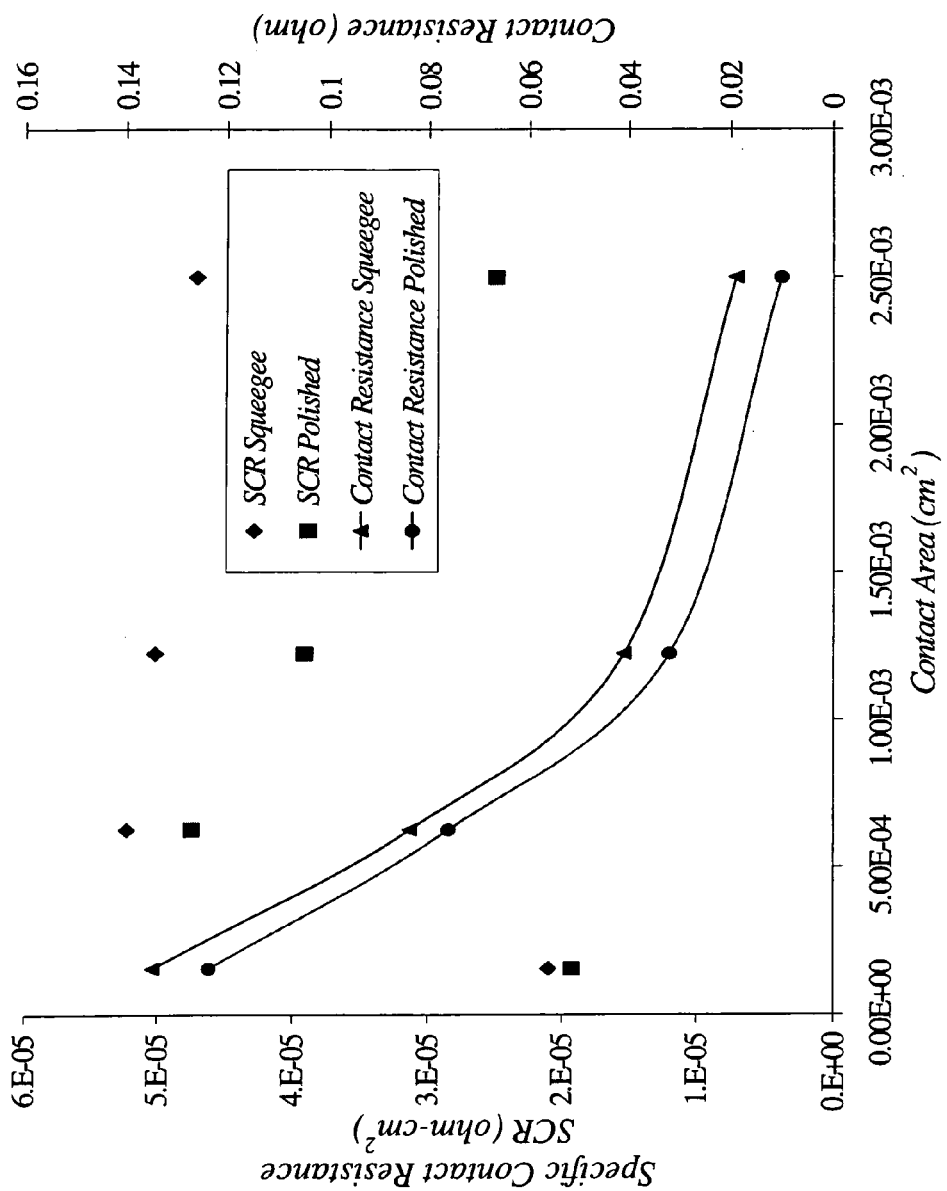
Fig. 7 - Contact Resistance and Specific Contact Resistance

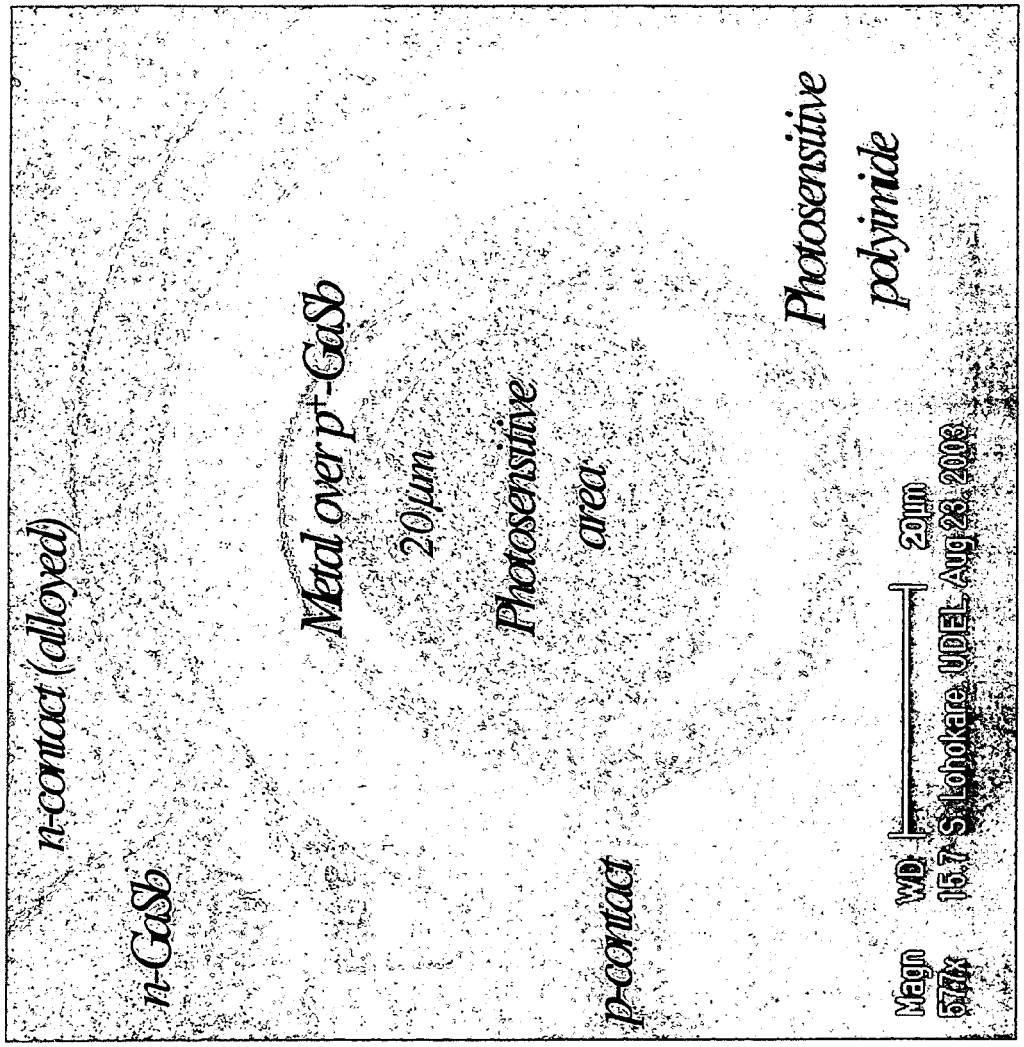
Fig. 8 – SEM View of AlGaAsSb/AlGaSb *p-i-n* Photodetector

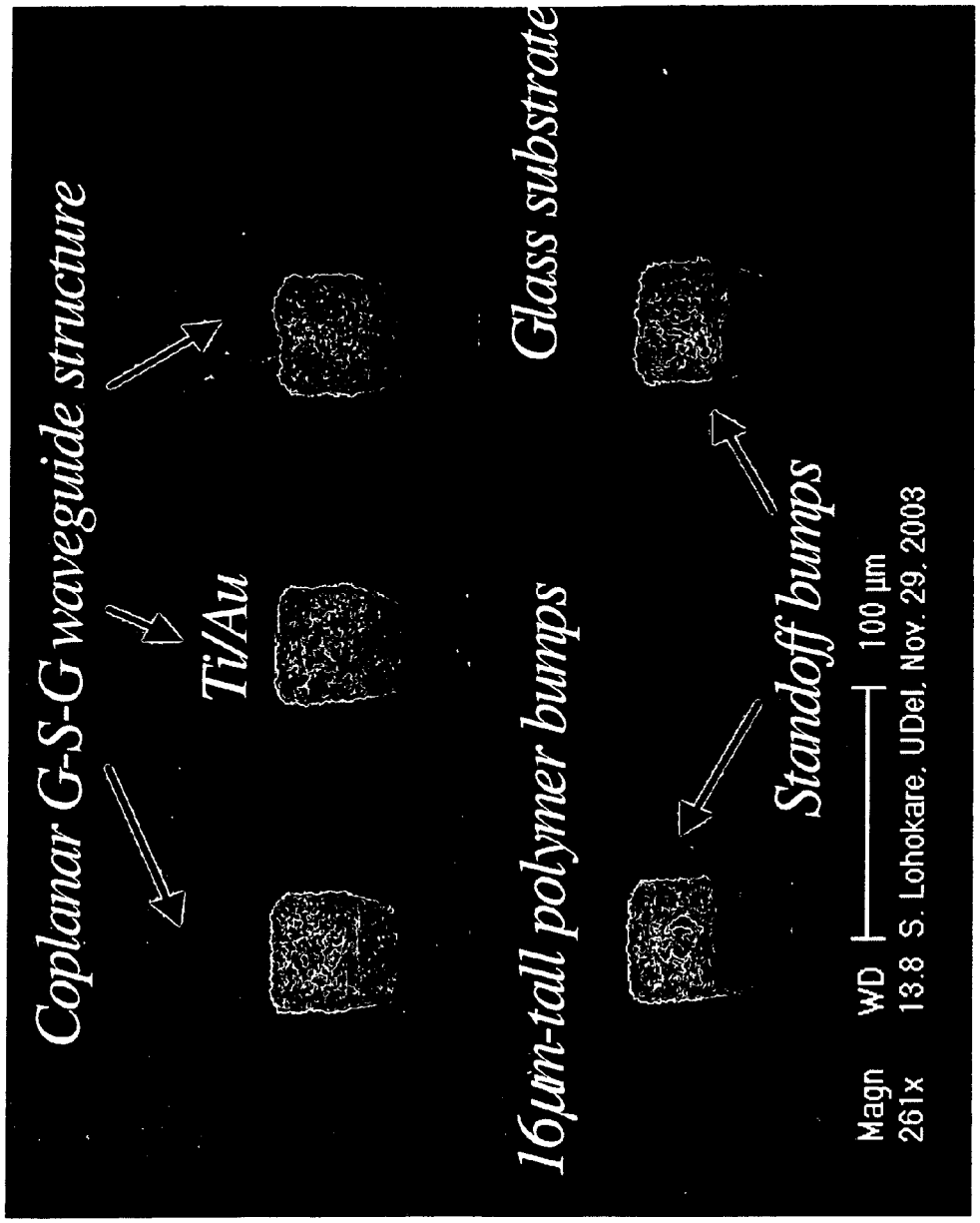
Fig. 9 – SEM View of Conductive Adhesive Bumps on Coplanar Waveguide

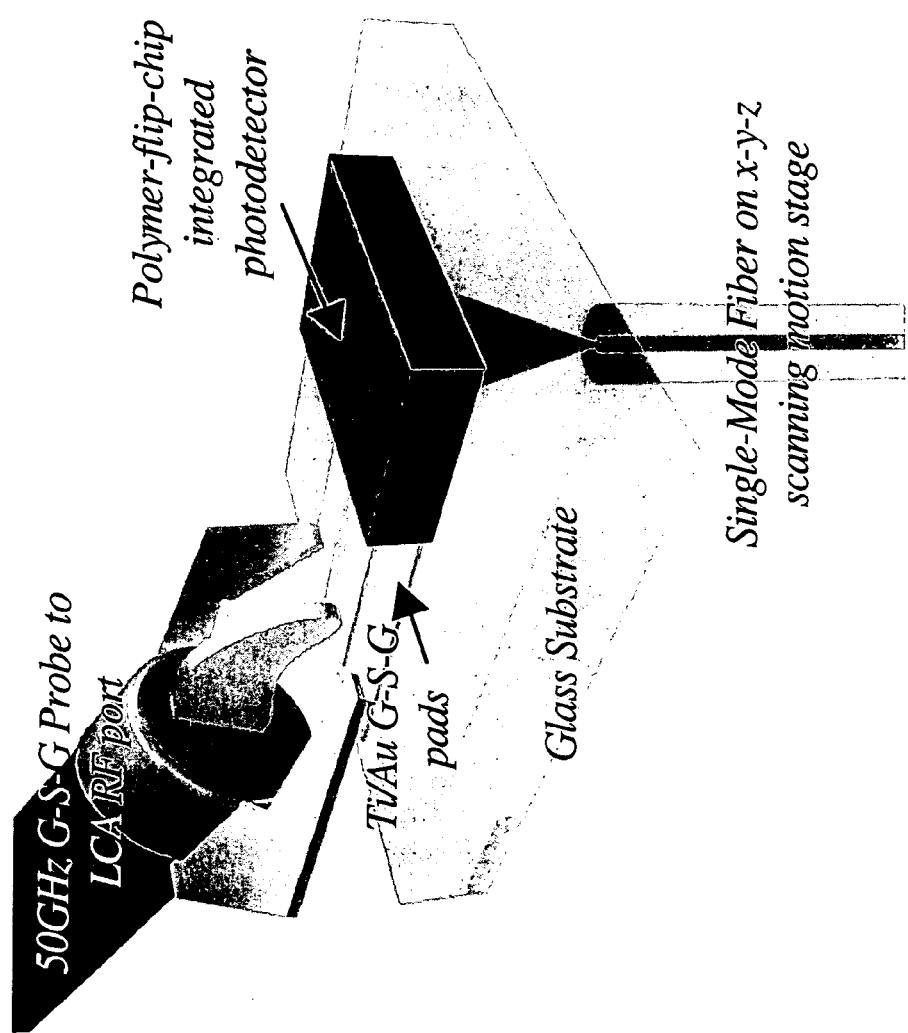
Fig. 10 – Schematic of Test Setup for PFC Integrated *p-i-n* Detector

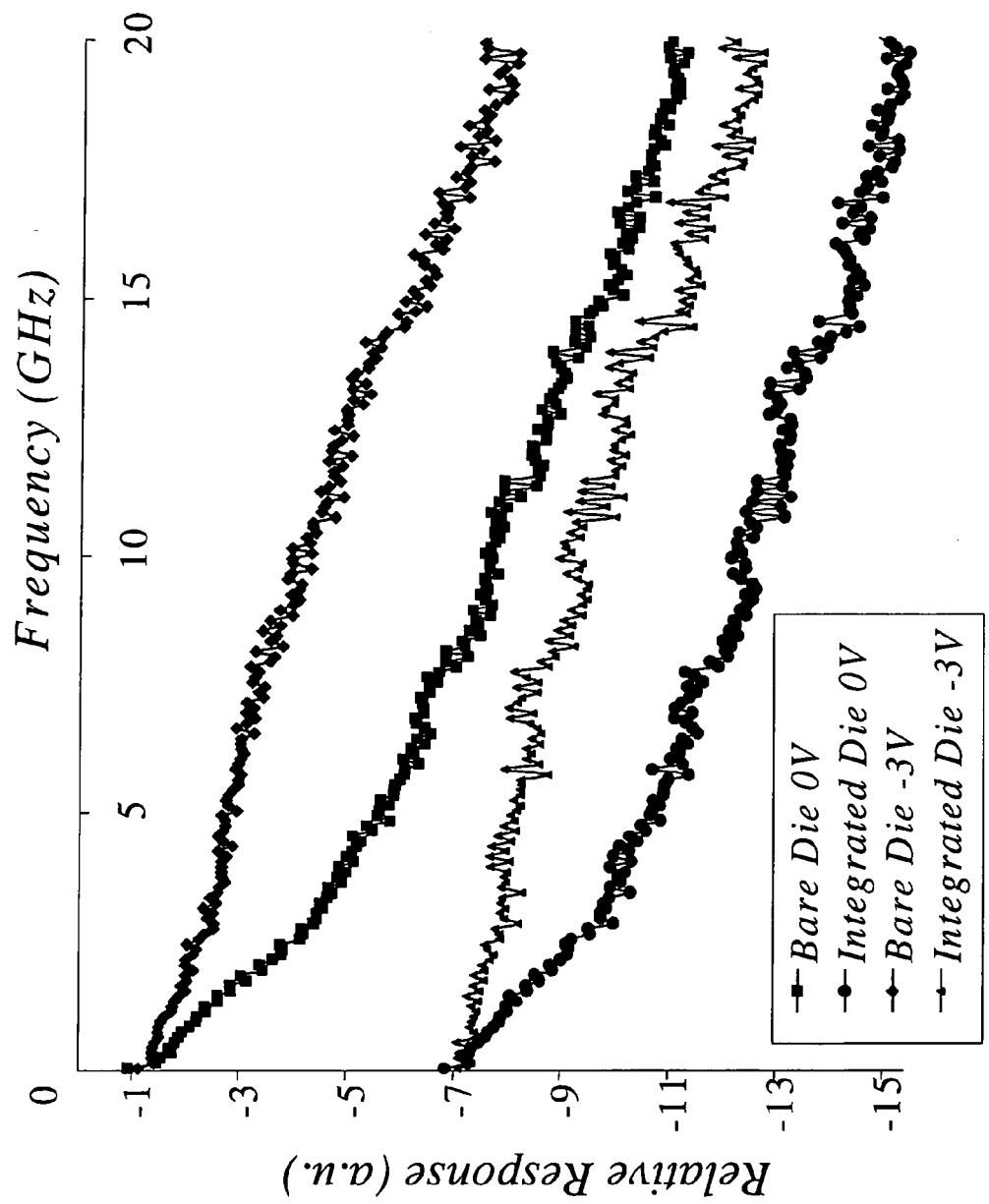
**Fig. 11 – Normalized BW Response for Bare-Die and PFC Integrated *p-i-n* Detector**

METHOD FOR CREATING FLIP-CHIP CONDUCTIVE-POLYMER BUMPS USING PHOTOLITHOGRAPHY AND POLISHING

CROSS REFERENCE TO RELATED APPLICATIONS

This application claims benefit under 35 U.S.C. §119(e) of U.S. Provisional Application for Patent Ser. No. 60/481,196 filed on Aug. 8, 2003, the entire contents of which are incorporated herein by reference.

STATEMENT REGARDING FEDERALLY FUNDED RESEARCH AND DEVELOPMENT

The United States Government may have certain rights to this invention as provided for in the terms and conditions, if any, under Defense Advanced Research Project Agency (DARPA) grant no. 1120-24596.

BACKGROUND

The disclosed invention relates to semiconductor device processing, and more particularly relates to a process for creating flip-chip conductive-polymer bumps using conventional photolithography and polishing techniques.

Conductive adhesive material technology has been extensively explored in the last decade as an alternative to replace conventional metallic solders in flip-chip packaging. Conductive adhesives offer several advantages as compared to metallic solders, for example, the fabrication techniques for such interconnects are simple, fast, and inexpensive. These materials are lead-free, have a superior environmental compatibility, and can be used with a wide range of surfaces including non-solderable surfaces. The lower temperatures required for processing result in lower thermal stress, and the lower thermo-mechanical fatigue results in a good temperature cycling performance. Further, thermoplastic conductive polymer interconnects can be reworked and reformed. Such materials also have the ability to absorb, and thus minimize, the stresses caused due to coefficient of thermal expansion (CTE) mismatches between dissimilar flip-chip mating surfaces.

Conventional commercial conductive adhesive manufacturing technology is based on screen-printing processes. While this approach can meet many demands of some applications, the next generation of semiconductor devices and systems will require processes that can enable cost-effectiveness and higher-performance levels. This requires development of a process that can enable definition of interconnects with higher resolution as compared to screen-printing, to enable finer pitch capability and greater control over the bump profile (e.g. bump height, size, and surface uniformity). Surprisingly little work has been done to address this problem.

As an example of conventional conductive polymer techniques, Kwang W. Oh, and Chon H. Ahn have described "A New Flip-Chip Bonding Technique Using Micromachined Conductive Polymer Bumps," IEEE Transactions on Advanced Packaging, Vol.22, No 4, November 1999. In this reference, the authors use a positive resist for photolithography and demonstrate bump formation, however their process does not describe a method which easily and repeatably dispenses and scrapes the polymer material. Also, hard baking the molds of positive resist at 150 C or 230 C results in their reduced solubility in acetone, making them difficult to strip.

C. K. Wong, O. C. Cheung, B. Xu, and M. M. Yuen have described a similar process, "Using PDMS Microtransfer molding for polymer flip-chip," Proceedings of the Electronic Components and Technology Conference (ECTC), IEEE, 652–657, (2003). In this approach, polydimethysiloxane micro-transfer templates were used to define the bumps.

In both of these approaches, however, the key to attaining good selectivity between the conductive adhesive and the photoresist templates was selective curing of both materials after squeegee-scraping excess adhesive from over the molds. These approaches used a high-viscosity conductive adhesive for defining the bumps. Consequently, mass-fabrication of conductive adhesive interconnects using both these approaches requires the development of specialized, and possibly trouble-prone head equipment for dispensing of the thick conductive adhesive, and for removing excess material from over the photoresist templates.

Additionally, using photoresist templates and squeegee for bump definition can result in a meniscus effect (bowing due to squeegee scraping over soft/flexible templates), which can cause a reduction in the effective surface area between the mating bump and pad, thereby resulting in a higher contact resistance and possibly reduced joint reliability.

Further, conventional micro/optoelectronic packaging industry polymer flip-chip wafer-bumping processes use screen-printing or stencil-printing techniques that offer relatively crude alignment resolution of approximately 10 μm. When high-viscosity polymers are used, silk-screens are needed, along with a relatively sophisticated head system for scraping and dispensing the polymer material by use of a polishing technique is required.

In general, lead-free conductive polymers are preferred materials for flip-chip interconnections, as they offer low temperature processing and simplistic fabrication steps as compared to conventional metallic solders, and are potentially less harmful to the environment. Unlike metallic solders, conductive polymers hold their shape when heated, thus making it possible to define bumps with a finer pitch.

Using photolithography to form flip chip bumps would not only improve the placement accuracy (bumping resolution), but would also allow for control of the height of the bump in order to cater to various applications, e.g., high-speed, high-power, etc. Application of this idea to replace screen-printing techniques has not received much success in the past, since this requires the development of sophisticated head equipment for dispensing and scraping of the polymer material. Such dispensing and scraping is necessary since baking the paste and photoresist together at high temperatures makes it difficult to selectively strip off the photoresist.

What is needed then is an alternative to the screen-printing technique used in the micro/optoelectronic packaging industry. What is further needed is an improved bump resolution as compared to screen-printing. What is still further needed is the obviation of the need for sophisticated head equipment that would otherwise be required to repeatably and accurately dispense and scrape the polymer bump material. What is even further needed is a method for commercial mass-fabrication of flip-chip interconnections which supports the use of relatively large wafers, e.g., up to 16 inches in diameter, by allowing a polishing process to remove excess bump-forming material uniformly over large wafers.

BRIEF SUMMARY

This disclosure provides a low-cost, and high-resolution process that completely obviates the need for dispensing and scraping head system required for mass-fabrication of lithographically patterned conductive adhesives. Using conventional microfabrication technology, conductive adhesive interconnects may be patterned, integrated, and implemented in semiconductor devices.

In order to address the above problems with conventional conductive polymer approaches, we have developed a new process that obviates the need for development of any dispensing/scraping equipment owing to the use of conventional micro-fabrication techniques for bump definition. This is facilitated by the use of a low-viscosity, thermoplastic conductive adhesive that is spun over lithographically patterned photoresist templates. The excess polymer material applied over the templates is removed after selective curing, by the application of a polishing step instead of using a squeegee. The use of a polishing technique offers the ability to achieve a bump surface uniformity comparable to the adhesive grain size (conducting particles are approximately 2–5 µm in diameter). This increases the effective contact area, resulting in lower contact resistance.

The approach in this disclosure is potentially lower cost due to the use of standard microfabrication techniques, i.e., photolithography and polishing, for bump formation. Also, a photolithographic approach offers increased control over the bump profile. This functionality is quite attractive for applications such as millimeter wave device/circuit packaging, where an accurate control over the bump height, size, and sidewall profile is necessary.

Using conventional micro fabrication techniques of this disclosure, and a new, low-cost wafer bumping process that enables a high-degree of control over patterning of conductive adhesive interconnects. This approach obviates the need for development of dispensing and scraping head system that is otherwise required for mass-fabrication of adhesive bumps using lithographic patterning. The new process uses a reworkable and flexible conductive adhesive, and offers better electrical performance as compared to squeegee-based definition techniques. A lower contact resistance for the flip-chip interconnects fabricated using the new process has been observed, as compared to that achieved using squeegee-based fabrication technique.

A method for fabricating a flip-chip semiconductor device having plural bumps includes forming plural molds on a substrate using a photolithographic technique; filling the molds by applying/spinning a layer of conductive material onto the substrate; selective curing; polishing the conductive material layer to remove excess conductive material from a surface of the substrate; and stripping the plural molds from the substrate to reveal the plural bumps.

In one embodiment of this disclosure, a method for forming conductive polymer contacts or bumps includes patterning and depositing metallized pads; forming plural molds on a substrate using a negative photoresist and UV photolithography; filling the molds by spinning a low-viscosity conductive polymer material to form a uniform layer of conductive polymer material on the substrate; baking the substrate, plural molds, and conductive polymer material at a temperature in the range of approximately 70 C–120 C to thicken any remaining conductive polymer material, thereby evaporating solvent in the uniform layer of conductive polymer material; stripping the plural molds using resist remover to reveal the plural bumps; polishing the uniform layer to remove excess conductive polymer material from the surface of the photoresist using an alumina grid having a first grain size; fine polishing any remaining excess conductive polymer material from the surface of the photoresist using an alumina grid having a second grain size smaller than the first grain size; and hardening the plural bumps by curing at a temperature in the range of approximately 190 C–230 C.

One application of the inventive method is in the formation of high-aspect ratio (4:1 or greater), conductive-polymer flip-chip interconnections. In order to overcome conventional problems, photolithography and polishing are used to facilitate selective removal of the excess conductive polymer and formation of flip-chip interconnection bumps.

DESCRIPTION OF THE DRAWINGS

FIG. 1 illustrates the process flow and fabrication steps of an embodiment of the method;

FIG. 2 shows polymer bumps resulting from the disclosed process using an optical microscope;

FIG. 3 shows an SEM view of conductive-polymer bumps of different sizes patterned using an embodiment of the method described herein;

FIG. 4 provides a close-up SEM view of one of the bumps of FIG. 3, demonstrating the fairly flat surface of the bump;

FIG. 5 provides a schematic of the test setup used to measure contact resistance of conventional bumps and bumps produced by an embodiment of the disclosure;

FIG. 6 provides a comparison of contact resistances using voltage (V) plotted versus current (I);

FIG. 7 compares contact resistance and specific contact resistance between bumps developed and polished using the method of this disclosure and conventional squeegeed bumps;

FIG. 8 provides an SEM view of an AlGaAsSb/AlGaSb p-i-n photodetector integrated with a carrier using polymer flip chip (PFC) bumps produced by an embodiment of the disclosed method;

FIG. 9 illustrates an SEM view of conductive adhesive bumps on a coplanar waveguide integrated with the p-i-n photodetector of FIG. 8;

FIG. 10 provides a schematic of a test setup for the integrated PFC p-i-n photodetector of FIG. 8 and the PFC bumps on the carrier of FIG. 9; and FIG. 11 provides a comparison of normalized bandwidth (BW) for "bare-die" and the PFC integrated p-i-n photodetector of FIGS. 8 and 9.

DETAILED DESCRIPTION

Our approach facilitates bump definition owing at least in part to the higher thermal conductivity of the under bump metallization (UBM), compared to that of the photoresist template. This results in better adhesion of the conductive adhesive to the metal, and prevents the adhesive from sticking to the photoresist. This eventually aids in stripping of the templates with high selectivity over the adhesive bumps after polishing. Exemplary steps of an embodiment of this disclosure relating to a method of defining the conductive polymer interconnects are depicted in FIG. 1.

In the first step of this exemplary embodiment, photolithography and lift-off of a negative photoresist (NR7) may be used to pattern Titanium/Gold (Ti/Au) under bump metallization (UBM) on a non-conducting substrate. A water droplet test may be used to ascertain that there is no oxide/contamination on the UBM, which if present, has the ability to affect the electrical transport properties of the adhesive-UBM interface. Next, a thick photoresist (AZ4620, a positive photoresist) may be used to create templates greater than or equal to the desired bump height. As one example, the material may be PSS8150 from Al Technology, which includes a thermoplastic polymer matrix interdispersed with high-volume loaded silver particles resulting in an essentially isotropic electrical conductivity. A low viscosity paste of this adhesive may be dispensed over the photoresist templates, and the wafer can be spun to obtain a relatively uniform film thickness.

Next, the conductive adhesive and the template may be baked at a temperature, e.g., 70 C, well below the glass transition temperature of the conductive adhesive, e.g., 190 C. This step drives away most of the thinning solvents, and makes the conductive adhesive relatively harder.

Then, the wafer may be attached to the head of a grinding and polishing machine using a low-melting point wax (to prevent curing of the adhesive during polishing step), and the adhesive may be polished down to the photoresist height using a coarse polishing grid size (~5 µm) followed by a fine (~1 µm) grid size. Using an optical microscope, the sample may optionally be inspected between polishing steps to determine if polishing has removed the adhesive to the point that the surface of the photoresist is exposed. Care should be taken to ensure that the wafer surface is maintained relatively parallel to the polishing grid at all times. Lack of co-planarity can result in delamination of the adhesive and/or the photoresist template.

After the polishing step, a water-based stripper may be used to selectively remove the photoresist molds, to leave the conductive polymer bumps on the UBM. Finally, the bumped substrate may be heated or cured over a hot plate, for example, at 190 C, i.e., the glass transition temperature, for 30 minutes. This cure step results in shrinkage of the bump, and this reduction in size is taken into account at the mask design stage. Further, curing at the glass transition temperature improves the conductivity and adhesion of the bumps.

In one embodiment of the invention, a method for creating high aspect ratio, flip-chip conductive polymer bumps includes using a low-viscosity, spin-on conductive polymer bump material that offers improved bumping resolution of approximately 2–3 microns using photolithography and polishing. Relatively high aspect ratio, e.g., at least 4:1, flip-chip interconnections are achievable.

In another exemplary aspect of this embodiment, negative photoresist, NR9-8000P (available from Futurrex, Inc.) is used to fabricate molds using UV lithography techniques. These molds are filled by spinning on conductive-polymer material (e.g., low-viscosity paste from Al Technology). The spinning process creates a relatively uniform layer of conductive polymer material.

Any excess conductive polymer material deposited on the surface of the photoresist after spinning may be removed using a polishing step. This polishing step may be performed using an alumina grid mounted on the rotating top of a polishing and lapping machine. Complete removal of the conductive polymer material is achieved by first using a grid having a 9-micron grain size, and then shifting to a 1-micron grain size. The sample wafer is preferably mounted on the polishing fixture using a low-melting-point (e.g., 56 C) wax so as to prevent the conductive paste from solidifying or curing during this step.

By the above technique, the benefits of lithography and polishing are combined to provide an alternative process to screen-printing techniques conventionally used in conductive polymer paste techniques. The process of forming the bumps is discussed below.

In an aspect of this embodiment, an oxidized silicon substrate ($5\times5$ cm$^2$ area) may be used, and photolithography and vacuum metal-deposition are used to pattern and deposit metallization test pads, respectively. Titanium/Gold (Ti/Au) layers may be used as contact metallization.

UV-negative, NR98000P resist in liquid solution may be deposited on the wafer by spinning, and then evaporating the solvent. This is followed by UV lithography using a 365-nm line. After hard baking and development, thick molds of NR9 resist are obtained.

Low-viscosity conductive polymer paste may then be dispensed onto the wafer using a dropper, and may then be spun to form a uniform layer of conductive polymer material.

The sample may be baked at 150 C for 3 minutes to thicken the conductive paste. Any excess polymer material deposited on the photoresist maybe removed using a polishing machine including a rotating alumina grid, first with a thicker grain size (e.g. 9 µm) and then fine polished with a finer grain size (e.g. 1 µm), for example. The second selected alumina grain size depends on the grain size of the conductive polymer.

The resist molds may then be stripped using resist remover, e.g. RR4, to leave a conductive bump pattern on metallized pads. The sample may then be cured at 230 C for approximately 1 minute to harden the bumps. A curing temperature lower than 200 C may be used for curing to ensure that the curing temperature is less than the glass transition temperature of the polymer.

Together, all steps of the disclosed method work according to the nature of the disclosure, i.e., the polishing step has eliminated the requirement for additional head equipment for scraping; the low-viscosity spin-on material creates a uniform conductive polymer layer and obviates the use of silk screens; and UV photolithography of negative resist NR9 is used to define the bumps with higher precision than screen-printing. In particular, FIG. 3 demonstrates that conductive polymer bumps are capable of being produced in different, controllable sizes by the method of this disclosure. FIG. 4 illustrates, in close-up, that the conductive polymer bump has a relatively flat surface.

The process described above can be modified and/or extended in a number of ways without departing from the spirit of invention. For example, in a different aspect of the embodiment, a different substrate material and/or metallization scheme may be used. In other aspects, a larger-sized substrate may be used, since the polishing-grid base is 400 mm in diameter. In addition, either a positive or negative resist may be used, however, we have found that negative photoresist is less susceptible to thermal cross-linking at higher temperatures, and positive resist is difficult to strip at higher temperatures. Positive photoresist, however, may be suitable at lower baking temperatures.

In still other aspects of the embodiment, a higher aspect ratio than NR9 (NR9 gives 4:1 aspect ratio) may be achieved using SU-8 resist, for example. A larger bump height results in greater thermo-mechanical stability of the conductive polymer joints. Also, the dissolution of resist may be accomplished by either using Acetone or by ashing in oxygen plasma. Further, the resist and polymer could be hard baked together and the excess polymer can be removed using chemical mechanical polishing (CMP).

This process provides a completely different alternative to conventional screen-printing techniques used in the micro/ optoelectronic packaging industry. Not only that, the process described above also offers improved bumping resolution as compared to screen-printing. The need for sophisticated conventional head equipment that would be otherwise required in order to repeatably and accurately dispense and scrape the polymer bump material is obviated.

Using photolithography to form conductive polymer bumps offers the ability to not only improve the placement accuracy (bumping resolution) but also allows creation of high-aspect-ratio bumps. In order to overcome conventional problems discussed above, photolithography and polishing are used in the disclosed and claimed invention to facilitate selective removal of any excess conductive polymer and formation of high-aspect ratio, flip-chip interconnection bumps. In addition to this, the various aspects of the embodiment of the invention are suitable for use in mass-fabrication of flip-chip interconnections due to the ability of the polishing process to remove conductive polymer uniformly from larger wafers, e.g., up to 16 inches in diameter. In using the above described process, it may become necessary to periodically thin the conductive-polymer paste from time to time, using a solvent such as mineral spirits. This may be needed since the low-viscosity paste used in various aspects of the embodiment may lose its thinning solvent over time, and might become too viscous for even coating.

TEST RESULTS

In order to characterize the electrical performance of these interconnects two tests were conducted. In the first test, contact resistance characterization was performed, and this data was compared with that obtained from bumps, fabricated using the squeegee approach. In the second case, 10 GHz photodetectors fabricated in an anti-monide material system were integrated on these bumps, and the speed performance of the integrated system was compared to that of the bare-die photodetector device.

The contact resistance measurements were performed using a four-terminal method. For this purpose, a four-terminal structure was fabricated on an oxidized silicon substrate. Test bumps of 125 µm×125 µm, 250 µm×250 µm, 350 µm×350 µm, and 500 µm×500 µm in size, and 16 µm in height were used to study static electrical performance. Two test structures of this type were fabricated; one using the process of an embodiment of this disclosure, and a second test structure which was processed using a conventional squeegee-based approach. The material used in both cases was PSS8150 from Al Technology.

An illustration of the four terminal structure used for this experiment is shown in FIG. 5, which includes drive-in and test bumps. The drive-in bumps act as series resistors for this measurement, and the contact resistance for the test bump is measured. This measurement used a Hewlett Packard 4155, Semiconductor Parameter Analyzer (SPA). The four ports of the SPA are configured such that a current source and a high-impedance voltmeter are implemented in the circuit loop. The high-impedance volt-meter sense current is very small relative to the current from the source, the contact resistance can be approximated as the ratio of the voltmeter reading to the drive current.

FIG. 6 shows the I–V curves obtained for the polished and the squeegeed bumps. The plot shows that the linearity of the I–V curves does not deviate for fairly large source currents. Also, a decrease in the slope of the curves, i.e., the contact resistance, for polished bumps is observed relative to the slope for squeegee bumps. This effect can be attributed to the greater effective area between mating surfaces due to the better surface uniformity obtained by polishing as compared to squeegee, which is characterized by the meniscus effect, discussed earlier.

FIG. 7 shows a plot for the contact resistance and the Specific Contact Resistance (SCR) versus contact area, for both squeegee and polished bumps. As expected, the contact resistance of the bumps decreases with increasing area. The SCR of the bumps formed using both the processes was found to be comparable to that of an ohmic metal-semiconductor contact ($\sim 10^{-5}$ cm$^2$ Ω-cm$^2$ range).

APPLICATIONS OF METHOD TO DEVICE FABRICATION

To study the dynamic performance characteristics of the conductive polymer bumps formed using the process described in this disclosure, high-speed photodetectors in a III–V antimonide material system were fabricated. The AlGa(As)Sb/GaSb are an alternative to the commercially used InGaAs/InP materials to realize photodetectors for 1.55 µm fiber-optic, free-space communication, and spectroscopy applications. A scanning electron micro-scope (SEM) viewgraph of this fabricated device is shown in FIG. 8.

While high-speed (~10 GHz) antimonide detectors can be found in literature for 1.3 µm wavelength, there is no report on high-speed 1.55 µm detectors grown on GaSb substrate. We thus investigated the design, growth, fabrication, and integration of an AlGaAsSb/AlGaSb p-i-n photodetector using a customized inductively coupled plasma-etching process.

As a carrier to couple and connect the photodetector to outside circuitry, FIG. 9 shows conductive adhesive bumps on a coplanar waveguide which includes coplanar ground-signal-ground (G-S-G) contacts, suitable for flip-chip integration, and designed for 10 GHz operation using App-Cad™ software. These contacts are 75 µm×75 µm, and have a 125 µm center-to-center pitch. Using this foot-print, UBM pads and conductive adhesive bumps were fabricated on a glass substrate using the process of this disclosure described above. The bumps were 50 µm×50 µm in area and ~16 µm tall. Additional standoff bumps were fabricated in order to maintain the photodetector sensitive area parallel to the glass substrate after bonding.

We are unaware of previous efforts which successfully integrates of such a detector or device into a semiconductor package which uses the more easily produced and scalable conductive polymer flip chip interconnections or bumps of our disclosed method. Use of our disclosed method could find application to connecting a variety of integrated optoelectronic or electronic device packages to outside processing circuitry.

During the integration process, the photodetector die (450 µm×450 µm) was flipped, aligned, and bonded over the conductive adhesive bumps shown in FIG. 9 at a temperature of 190 C, with a bond load of 105 grams. In order to test the performance of this integrated structure, the bandwidth characteristics were measured and compared to those obtained from bare-die measurements.

For measuring the bandwidth characteristics of the integrated detector, and with reference to FIG. 10, an Agilent 8703B lightwave component analyzer (LCA) was used. In this mode, the LCA measures the response from an optical-to-electrical component using a laser and a detector with a known frequency response. A 1.55 µm laser beam from the LCA lightwave transmitter port was coupled to the integrated detector using a cleaved single mode (SMF-28) optical fiber mounted on an x-y-z motion stage.

The motion stage was used to position the fiber in such a way that most of the power from the LCA lightwave transmitter port could be coupled to the detector. This was achieved by scanning the fiber in x, y and z, until the highest DC-level for the photocurrent was achieved. This form of coupling had to be implemented since coupling the signal through the GaSb-substrate would mean that most of the optical power would be absorbed in the substrate owing to the fact that the substrate has a bandgap comparable to that of the active area of the p-i-n structure. The electrical interface from the detector to the LCA RF port was implemented using a 50 GHz ground-signal-ground (G-S-G) probe, chosen with pitch specifications similar to that of the G-S-G traces patterned on the substrate shown in FIG. 9.

The dynamic performance characteristics of the polished conductive adhesive interconnects were studied using 10 GHz AlGaAsSb/AlGaSb p-i-n photodetectors as a case study. Comparison of the bandwidth characteristics of these bare-die and integrated detectors was done to show that there is minimum degradation in high-speed performance of the p-i-n detector due to integration on conductive adhesive bumps, as shown in FIG. 11.

It may be seen that the embodiment and aspects of the invention may be varied in many ways. Such variations are not to be regarded as a departure from the spirit and scope of the invention, and all such modifications as would be obvious to one skilled in the art are intended to be included within the scope of the following claims. The breadth and scope of the present invention is therefore limited only by the scope of the appended claims and their equivalents.

The invention claimed is:

1. A method for fabricating a flip-chip semiconductor device having high aspect ratio plural conductive polymer bumps thereon, the method comprising: forming plural molds on a substrate using a photolithographic technique; filling the molds by spinning a layer of conductive polymer material onto the substrate; polishing the conductive polymer material layer to remove excess conductive material from a surface of the substrate; and exposing the plural conductive polymer bumps by removing the plural molds from the substrate.

2. A method for fabricating a flip-chip semiconductor device having plural conductive polymer bumps thereon, the method comprising:

patterning and depositing metallized pads on a substrate;

photolithographically forming plural molds on the substrate using a photoresist, wherein the plural molds are in registration with the metallized pads;

filling each of the plural molds by applying a low-viscosity conductive polymer material; spinning the substrate to form a uniformly distributed conductive polymer layer;

baking the substrate, plural molds, and conductive polymer material to thicken any remaining conductive polymer material and evaporate any solvent in the conductive polymer layer;

polishing the conductive polymer layer to remove excess conductive polymer material from a surface of the photoresist;

stripping the plural molds to reveal the plural conductive polymer bumps; and hardening the plural conductive polymer bumps by temperature curing.

3. The method of claim 2, wherein the photoresist is a negative resist.

4. The method of claim 2, wherein the photoresist is a positive resist.

5. The method of claim 2, further comprising, after polishing the conductive polymer layer, fine polishing the conductive polymer layer using a grid having a grain size smaller than a first grain size used in polishing the conductive polymer layer.

6. The method of claim 2, wherein baking the substrate is accomplished at a temperature in a range of approximately 70 C–120 C.

7. The method of claim 2, wherein stripping the plural molds is accomplished using a resist remover.

8. The method of claim 2, wherein the temperature curing is accomplished at a temperature in the range of approximately 190 C–230 C.

9. The method of claim 2, wherein the temperature curing is accomplished at a temperature of approximately 190 C for about 30 minutes.

10. The method of claim 2, wherein the temperature curing is accomplished at a temperature equal to or greater than a glass transition temperature of the conductive polymer.

* * * * *